United States Patent [19]

Rockett, Jr.

[11] 4,011,471
[45] Mar. 8, 1977

[54] SURFACE POTENTIAL STABILIZING CIRCUIT FOR CHARGE-COUPLED DEVICES RADIATION HARDENING

[75] Inventor: Leonard R. Rockett, Jr., New York, N.Y.

[73] Assignee: The United States of America as represented by the Secretary of the Air Force, Washington, D.C.

[22] Filed: Nov. 18, 1975

[21] Appl. No.: 633,131

[52] U.S. Cl. .............................. 307/308; 307/297; 307/304; 357/29

[51] Int. Cl.² ..................... H03K 1/02; H03K 1/10; H01L 27/14

[58] Field of Search .......... 307/296, 297, 304, 308, 307/221 D; 328/1; 357/24, 25, 29

[56] References Cited

UNITED STATES PATENTS

| | | | |
|---|---|---|---|
| 3,409,839 | 11/1968 | Crowe | 307/308 X |
| 3,524,999 | 8/1970 | Fletcher et al. | 307/308 |
| 3,806,741 | 4/1974 | Smith | 307/304 |
| 3,823,332 | 7/1974 | Feryszka et al. | 307/297 |

OTHER PUBLICATIONS

Murray et al., "Radiation–resistant COS/MOS devices," *RCA Engineer*, Scient. Lib. 1/18/1972, pp. 40–44.
Gregor et al., "Reducing Radiation Damage in IN–CHANNEL IGFET's," *IBM Tech. Discl. Bull.*, vol. 13, No. 11, p. 3281, 4/1971.
Newman et al., "Effect of Electron Radiation on Silicon Nitride IGFETs," *IEEE Trans. on Nuclear Science*, 12/1967, pp. 293–298.

*Primary Examiner*—John S. Heyman
*Assistant Examiner*—Larry N. Anagnos
*Attorney, Agent, or Firm*—Joseph E. Rusz; George Fine

[57] ABSTRACT

An integrable circuit incorporated with charge-coupled devices to stabilize the surface potential against oxide charging effects by regulating the applied gate voltage. By incorporating the circuit with charge-coupled devices, the complete integrated unit is effectively radiation hardened over an extended range of operation.

3 Claims, 1 Drawing Figure

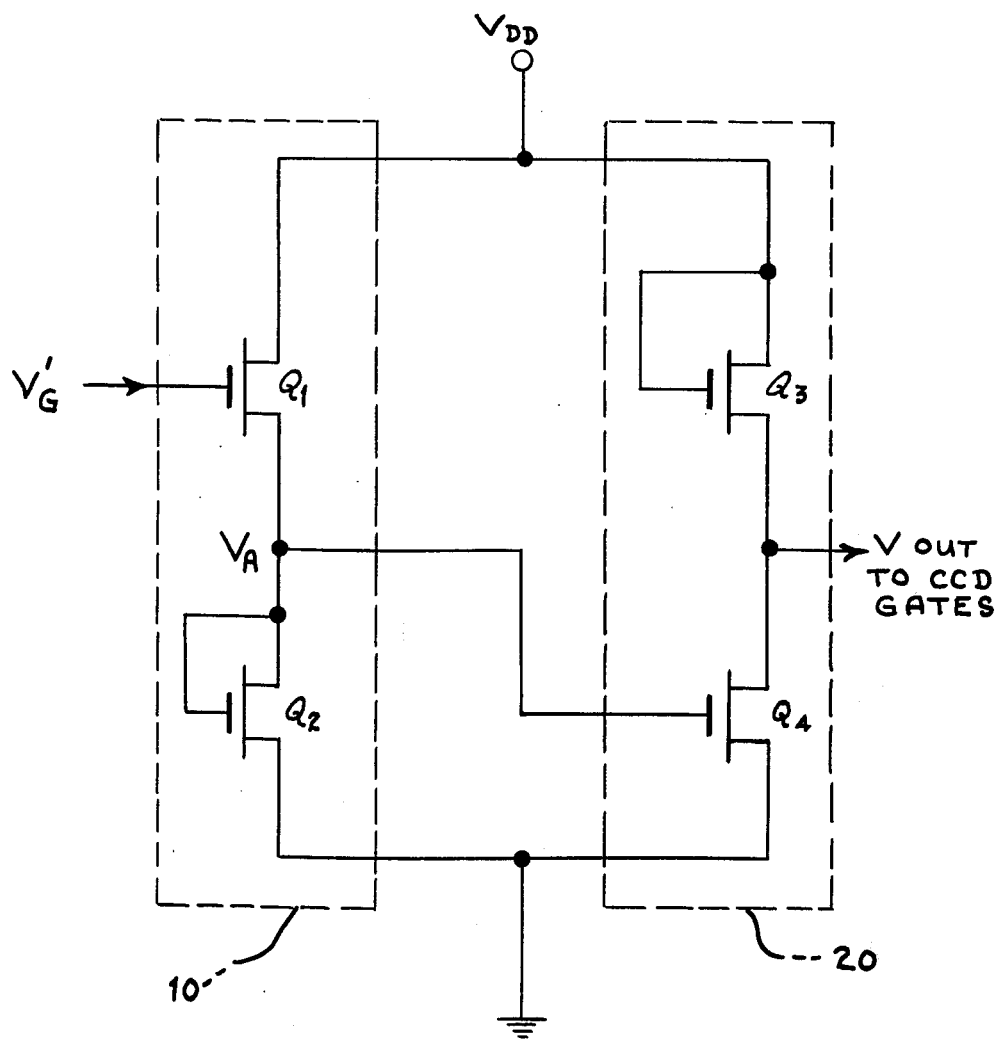

SURFACE POTENTIAL STABILIZING CIRCUIT FOR CHARGE-COUPLED DEVICES RADIATION HARDENING

STATEMENT OF GOVERNMENT INTEREST

The invention described herein may be manufactured and used by or for the Government for governmental purposes without the payment of any royalty thereon.

BACKGROUND OF THE INVENTION

In the prior art charge-coupled devices (CCD) a limitation in their operation occurred because of radiation effects thereupon. A common effect observed in both surface and buried channel CCD's was the threshold voltage shifts caused by radiation-induced increases of positive oxide charge.

This oxide charging effect was the principal limiting factor in buried channel devices exposed to radiation, because it caused surface potential variations that decreased the device's full well signal charge capacity. When operated at initially set gate voltages, the device ceased to function in the buried channel mode at advanced levels of the increased oxide charge. Oxide charging effects, similarly, degrade the performance of the irradiated surface channel devices.

The present invention provides an easily integrable circuit that when incorporated with a CCD stabilizes the surface potential against oxide charging effects by regulating the applied gate voltage. Incorporating this circuit with the buried channel CCD, the complete integrated unit (i.e., circuit and CCD) is effectively radiation hardened over an extended range of operation. Similarly, using this circuit to regulate the gate potential of the surface channel CCD, the range of operation of the CCD is a radiation environment is extended. In addition, a small DC current level ("fat zero") must be included to control interface losses. This circuit aids in optimizing and stabilizing the efficient performance of charge-coupled devices.

It is noted that charge-coupled devices have many potential applications in electronic systems. These devices can be used for optical and infrared imaging systems, delay lines, and a variety of signal processing functions. If any system employing charge-coupled devices is to be used in a space or nuclear radiation environment this invention may be essential to the proper operation of the device. In nonradiation environments, the invention may improve the long life reliability of the circuit.

SUMMARY OF THE INVENTION

A surface potential stabilizing for CCD radiation hardening is provided. An easily integrable circuit is utilized which stabilizes the surface potential of the CCD (charge-coupled device) against potential variations caused by radiation-induced positive oxide charge. The circuit enables the CCD to operate efficiently within an extended range in a radiation environment, thereby making the device effectively radiation hardened. The circuit includes first and second MOSFETs that provide a source follower stage. The first is the input device and the second is a saturated MOS load. The output from the source follower is fed to an inverter stage formed by third and fourth MOSFETs. a The third is a saturated MOS load and the fourth is a sensing device with a specified gate oxide thickness. The circuit operates in a saturated mode. This makes it less sensitive to radiation-induced oxide charging effects which ensures its proper functioning in a radiation environment.

The circuit is easily integrable on a CCD chip by using existing MOS processing technology. The circuit, further, can be used with p-type or n-type devices that conduct in either buried or surface channel modes. Still further, the current only requires only one added external lead from the integrated chip. The circuit, being comprised of $Q_1$, $Q_2$, $Q_3$ and $Q_4$, utilizes a common substrate.

DESCRIPTION OF THE DRAWING

The single FIGURE shows a preferred embodiment in schematic form.

DETAILED DESCRIPTION OF THE PREFERRED EMBODIMENT

Referring in detail to the single FIGURE, $Q_1$ and $Q_2$ are MOSFETs that provide a source follower stage 10. $Q_1$ is the input device and $Q_2$ is a saturated MOS load. The output from source follower 10 is fed to inverter stage 20 formed by MOSFETs $Q_3$ and $Q_4$. $Q_3$ is a saturated MOS load and $Q_4$ is the sensing device with a preselected gate oxide thickness. $Q_1$, $Q_2$, $Q_3$ and $Q_4$ utilize a common substrate and each includes a gate, source and drain with the gate having a predetermined oxide thickness.

The current operates in a saturated mode. This makes it less sensitive to radiation-induced oxide charging effects which ensures its proper functioning in a radiation environment.

Voltage $V_G'$ is externally applied to input device $Q_1$. The effect source follower stage 10 has on the applied voltage is to modify it by an amount equal to the threshold voltage of the input device. This modified input into inverter stage 10 at $Q_4$ offsets the threshold voltage error that would have appeared at circuit output, $V_{out}$. The output expression from the stabilizing circuit is thus, $$V_G' + V_{TQ_4}$$

where $V_G'$ is the applied voltage; and
$V_{TQ_4}$ is the threshold voltage of $Q_4$.

This output is now fed to the CCD gates via an integrated AC-DC clamping circuit.

Device (MOSFET) $Q_4$ is the sensing device. It has a specified thickness, $t_{ox_4}$, which exactly matches that of the CCD gates it is designed to track. When the integrated unit (the stabilizing circuit and the CCD) is exposed to a uniform radiation environment, any change in the initial magnitude of the fixed oxide charge is detected at the output of the stabilizing circuit in the form of $V_{TQ_4}$. Therefore, for a set applied voltage, an increase in the magnitude of positive oxide charge appears as an increase or decrease of $V_{out}$ depending on the designed conducting carrier polarity (i.e., n-channel or p-channel) This circuit thus stabilizes the CCD's surface potential against radiation-induced increases in fixed oxide charge, making the complete integrated unit self-compensating within an extended range of efficient operation. When the integrated unit is not exposed to radiation environments, the stabilizing circuit has no hampering effect on the efficient operation of the CCD. When the integrated unit is not exposed to radiation environments, the stabilizing circuit has no hampering effect on the efficient operation of the CCD.

The design specifications of the individual devices are the most important factors in establishing the circuit's function.

1. To equalize the threshold voltages of $Q_1$ and $Q_3$:

$$t_{ox_1} = t_{ox_3}$$

where $t_{ox_1}$ and $t_{ox_3}$ are the gate oxide thickness of $Q_1$ and $Q_3$, respectively.

2. $t_{ox_4}$, the gate oxide thickness of $Q_4$ is specified.
3. $K_1 \gg K_2$ where $$K = \frac{\mu \epsilon_{ox}}{2 t_{ox}} \frac{W}{l}.$$

Therefore, $$\frac{W_1}{t_{ox_1} l_1} \gg \frac{W_2}{t_{ox_2} l_2}$$

4. $K_3 = K_4$ Therefore, $$\frac{W_3}{t_{ox_3} l_3} = \frac{W_4}{t_{ox_4} l_4}$$

5. $V_{DD} = 2 V_G'$.

It is emphasized that the stabilizing circuit is easily integrable on the CCD chip by using existing MOS processing technology, thus providing a common substrate. Further, the circuit can be used with p-type or n-type devices that conduct in either the buried channel or surface channel mode. Still further, the circuit only requires only one added external lead ($V_{DD}$) from the integrated chip.

What is claimed is:

1. A surface potential stabilizing circuit for charge-coupled device radiation hardening comprising first and second MOSFET devices, in combination, forming a source follower stage, said first MOSFET device having a first predetermined threshold voltage and operating as an input device to receive an applied voltage, $V_G'$, said source follower stage modifying said applied voltage, $V_G'$, by an amount equal to said first predetermined threshold voltage, said second MOSFET device being a saturated MOS load for said source follower stage, third and fourth MOSFET devices, in combination, forming an inverter stage, said fourth MOSFET device having a second predetermined threshold voltage, the modified applied voltage from said source follower stage being received by said fourth MOSFET device to offset any threshold voltage error to appear at the stabilized circuit output with the stabilized circuit output voltage being the sum of $V_G'$ and said second predetermined threshold voltage, said third MOSFET device operating as a saturated MOS load for said inverter stage.

2. A surface potential stabilizing circuit as described in claim 1 wherein said first, second, third and fourth MOSFET devices each include a gate, source, and drain, each of said gates having a gate oxide predetermined thickness, with the gate oxide thickness of said fourth MOSFET device being $t_{ox_4}$ matching exactly the charge-coupled device integrated therewith, said gate of said first MOSFET receiving as an input the voltage $V_G'$ and said drain of said first MOSFET and said gate and drain of said third MOSFET receiving a voltage $V_{DD}$.

3. A surface potential stabilizing circuit as described in claim 1 wherein said first, second, third and fourth MOSFET devices each include a gate, source, and drain, with each of said gates having a predetermined oxide thickness with the gate oxide thickness of said fourth MOSFET device being a specified $t_{ox_4}$ and with gate oxide thickness $t_{ox_1}$ of said first MOSFET device being equal to gate oxide thickness $t_{ox_3}$ of said third MOSFET device thereby equalizing the threshold voltages of said first and third MOSFET devices, said gate of said first MOSFET receiving as an input the voltage $V_G'$ and said drain of said first MOSFET and said gate and drain of said third MOSFET receiving a voltage, $V_{DD}$.

* * * * *